United States Patent [19]

Pelley, III et al.

[11] Patent Number: 5,726,944
[45] Date of Patent: Mar. 10, 1998

[54] VOLTAGE REGULATOR FOR REGULATING AN OUTPUT VOLTAGE FROM A CHARGE PUMP AND METHOD THEREFOR

[75] Inventors: Perry H. Pelley, III, Austin, Tex.; Robert C. Taft, Salem, N.H.

[73] Assignee: Motorola, Inc., Schaumburg, Ill.

[21] Appl. No.: 596,809

[22] Filed: Feb. 5, 1996

[51] Int. Cl.[6] .................................................. G11C 13/00
[52] U.S. Cl. ................................... 365/226; 365/189.01
[58] Field of Search .................................. 365/228, 226, 365/227, 189.01

[56] References Cited

U.S. PATENT DOCUMENTS 4,903,236  2/1990  Nakayama ........................ 365/189.01
5,303,190  4/1994  Pelley, III ............................... 365/189
5,381,051  1/1995  Morton ............................... 365/189.01

*Primary Examiner*—Terrell W. Fears
*Attorney, Agent, or Firm*—Bruce E. Hayden

[57] ABSTRACT

An SRAM memory cell (10) is provided a boosted voltage by a charge pump (56) to reduce the soft error rate within the SRAM (10) and to improve bit cell stability. A voltage regulator (58) is coupled to the charge pump (56) to regulate the operation of the charge pump (56) and its outputted boosted voltage. The voltage regulator (58) regulates the boosted voltage over three operating states: low supply voltage, steady state operation, and burn-in.

23 Claims, 8 Drawing Sheets

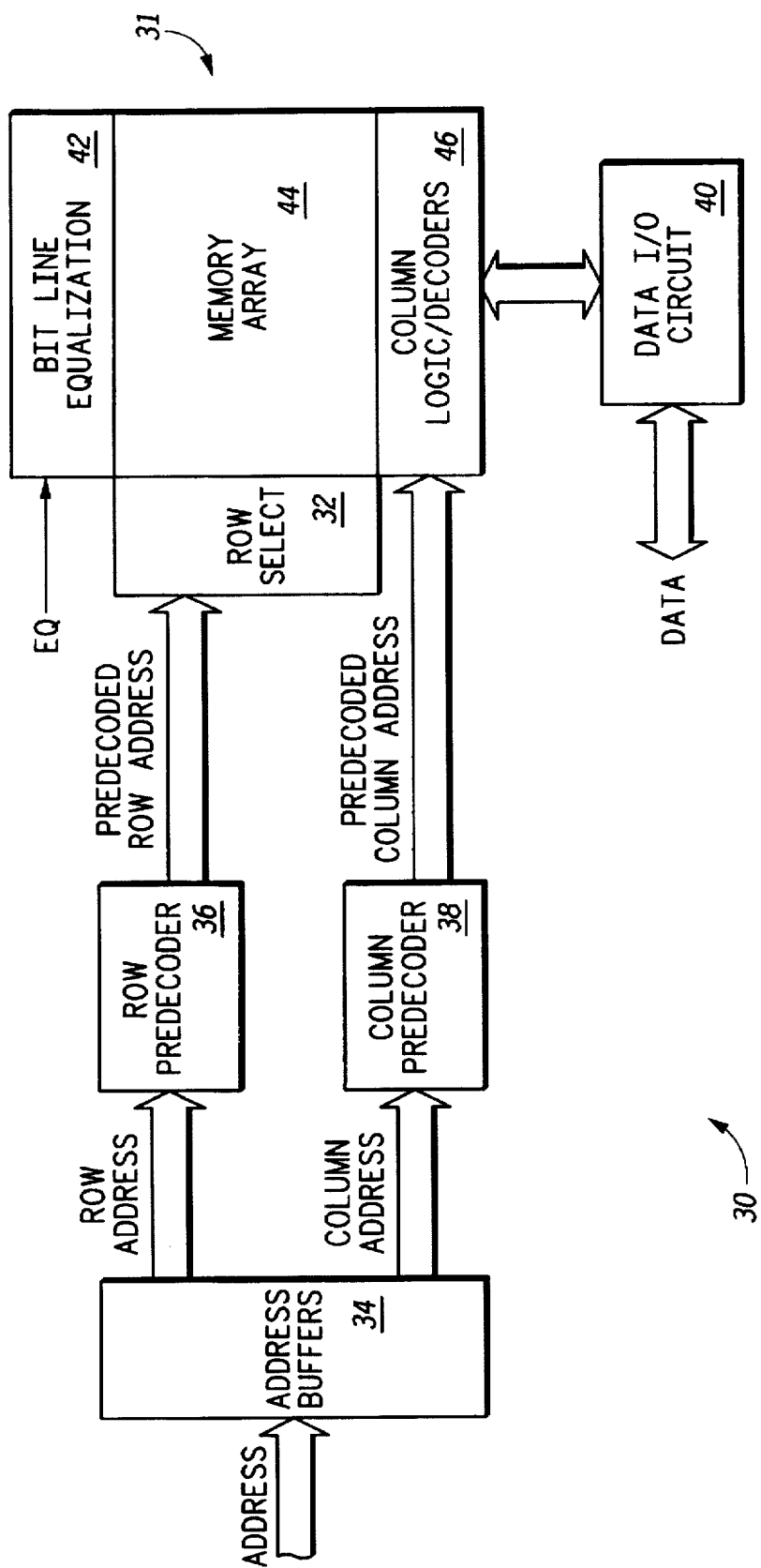
FIG. 2 —PRIOR ART—

VOLTAGE REGULATOR FOR REGULATING AN OUTPUT VOLTAGE FROM A CHARGE PUMP AND METHOD THEREFOR

CO-PENDING APPLICATION

This application for patent is related to co-pending U.S. patent application having Attorney Docket Number SC02731A, entitled "CHARGE PUMP HAVING REDUCED THRESHOLD VOLTAGE LOSSES," which is hereby incorporated by reference herein.

FIELD OF THE INVENTION

This invention relates in general to integrated circuits, and more particularly, to a voltage regulator for a charge pump.

BACKGROUND INFORMATION

FIG. 1 illustrates in schematic diagram form six-transistor memory cell 10 according to the prior art. Memory cell 10 includes N-channel transistors 11 and 12, P-channel transistors 13 and 14, and N-channel pass transistors 15 and 16. The gates of N-channel transistor 11 and P-channel transistor 13 are connected to node 102. The gates of N-channel transistor 12 and P-channel transistor 14 are connected to node 101. N-channel pass transistor 15 has a first current electrode connected to node 101 and a second current electrode connected to bit line 17 labeled "BL". N-channel pass transistor 16 has a first current electrode connected to node 102 and a second current electrode connected to bit line 18 labeled "BL*". (Note that an asterisk "*" after a signal or line name indicates that the signal or line is a logical complement of a signal or line having the same name but lacking the asterisk "*".) The gates of N-channel pass transistors 15 and 16 are connected to word line 19 labeled "WL". N-channel pass transistors 15 and 16 couple nodes 101 and 102, respectively, to bit lines 17 and 18 when word line 19 is enabled as a logic high. The sources of P-channel transistors 13 and 14 are connected to a positive power supply voltage terminal labeled "$V_{DD}$". The source of each of N-channel transistors 11 and 12 is connected to a negative power supply voltage terminal labeled "$V_{SS}$". $V_{SS}$ is normally at ground potential and $V_{DD}$ receives a power supply voltage of about 3.3 volts. A power supply voltage of about 3.3 volts may range between about 3.0 volts and about 3.6 volts.

N-channel transistors 11 and 12 and P-channel transistors 13 and 14 form a cross-coupled latch. Memory cell 10 stores a data bit based on the voltages at nodes 101 and 102. Reading and writing to memory cell 10 is accomplished through bit lines 17 and 18. To write data into memory cell 10, word line 19 is enabled as a logic high and complementary data signals are applied to bit lines 17 and 18 at a potential high enough to overwrite the contents of the memory cell. The voltage on bit lines 17 and 18 is approximately at the potential of $V_{DD}$ for a logic high and near $V_{SS}$ for a logic low. Memory cell 10 will latch in either a logic high or a logic low state depending on the logic stages of bit lines 17 and 18.

Assuming bit line 17 is a logic high and bit line 18 is a logic low when word line 19 is enabled, N-channel pass transistors 15 and 16 become conductive. The logic states of bit lines 17 and 18 are provided to nodes 101 and 102. Node 101 becomes a logic high, causing P-channel transistor 14 to become substantially nonconductive and N-channel transistor 12 to become conductive. Node 102 is reduced to a logic low voltage equal to approximately the negative power supply voltage. P-channel transistor 13 is conductive, and N-channel transistor 11 is nonconductive. Initially, a logic high voltage at node 101 is approximately equal to the positive power supply voltage minus a threshold voltage drop ($V_T$) across N-channel transistor 15. The voltage at node 101 will then be pulled by P-channel transistor 13 to approximately the potential of $V_{DD}$. The $V_T$ across N-channel transistor 15 is equal to approximately 1.4 volts with a power supply voltage of 3.3 volts due to body effect.

For memory cells having TFT loads or resistor loads, the delay between the word line select and the time required for node 101 to reach $V_{DD}$ may be substantial. During this time, bit cell stability is reduced, due, at least in part, to the reduced voltage on at node 101 representing the logic 1, and the reduced holding current through N-channel transistor 12 which maintains a logic 0 on node 102. During a read cycle of memory 30, word line 19 is enabled, causing the N-channel pass transistors coupled to the node at a logic 0 to be conductive. Column logic/decoders select bit lines 17 and 18 to read the data bit stored in memory cell 10. The latched logic states stored on nodes 101 and 102 are provided to bit lines 17 and 18 as a relatively low differential voltage (approximately 50–100 millivolts). During a read cycle, the logic states of nodes 101 and 102 remain unchanged.

Memory cell 10 maintains the current logic state for as long as a power supply voltage is provided. However, memory cell 10 may inadvertently change logic states due to charged particle emissions. These charged particles include alpha particles, x-rays, or other sources of ionizing radiation. Alpha particles are emitted as a result of the natural radioactive decay of radioactive elements such as uranium, americium, and thorium. Uranium and thorium are sometimes present in semiconductor packaging material in small amounts. Radioactive elements may also be present in the aluminum layers of the integrated circuit. The alpha particles are emitted from the radioactive elements and penetrate the memory array region of the SRAM cell. An alpha particle striking in the vicinity of memory cell 10, if large enough, may change the logic state of the cell. When an alpha particle strikes the integrated circuit, electrons migrate toward the most positive sources. This is called a soft error. A soft error is difficult to detect because the memory cell changes logic states without suffering any physical damage.

The critical charge ($Q_{CRIT}$) required to cause memory cell 10 to change logic states is equal to the product of the change in voltage as a result of the alpha particle hit ($\Delta V_\alpha$), and the cell capacitance ($C_{CELL}$), or $$Q_{CRIT} = \Delta V_\alpha C_{CELL} \tag{1}$$

Various techniques have been found to reduce soft error in memory cell 10. For instance, soft error is sometimes reduced by increasing cell capacitance $C_{CELL}$. Cell capacitance $C_{CELL}$ is increased by adding capacitance to N-channel transistors 11 and 12 of memory cell 10, or by coupling capacitors between each of nodes 101 and 102 and $V_{SS}$. $Q_{CRIT}$ should be made large enough to withstand the charge leakage caused by an alpha particle hit. However, write speed may be sacrificed if cell capacitance $C_{CELL}$ is too large. Increasing $Q_{CRIT}$ by adding capacitance increases the voltage change $\Delta V_\alpha$ required to cause memory cell 10 to change logic states. But, adding capacitance to memory cell 10 increases process constraints and may increase the surface area required for each SRAM cell.

As the density and size of SRAMs are increased, memory cell sizes reduced, and power supply voltage decreased, memory cell 10 becomes even more vulnerable to soft error. Also, P-channel transistors 64 and 65 may be thin film transistor (TFT) loads. TFT transistors provide the advantages of low standby current and good cell stability without increasing cell size. However, the small size of a TFT transistor results in decreased cell capacitance, which also may cause increased soft error. Thus, in a very high density SRAM, as memory cell size is reduced, it becomes harder to increase cell capacitance $C_{CELL}$ without negating, at least in part, the reduction in size.

As disclosed in U.S. Pat. No. 5,303,190, which is hereby incorporated by reference herein, a charging circuit may be provided to boost the supply voltage provided to the plurality of memory cells in order to make the memory more resistant to soft errors. Such a charging voltage is supplied by a charge pump, which typically receives an oscillating signal, and transforms this oscillating signal into a voltage that is higher than the supply voltage provided to the memory cells.

However, with such a charge pump, there is a need to regulate the level of the boosted voltage output from the charge pump. In addition, this regulation needs to be precise so that the boosted voltage is maintained at a substantially constant level. Tighter regulation of the boosted voltage will ensure that the minimum level that the boosted voltage will encounter will be sufficient to ensure reliability of the operation of the bit cell during normal operation.

Furthermore, during testing of the SRAM, there is a need to reduce the operating voltage to measure bit cell margins.

Yet still further, there is a need to maintain the boosted voltage above the supply voltage $V_{DD}$ during burn-in when $V_{DD}$ is increased beyond its ordinary operating level to achieve the appropriate electric fields across the bit cell transistors.

And, there is a need to limit the boosted voltage from exceeding the supply voltage by more than a certain amount to prevent leakage of the stored charge in the bit cell onto the bit lines, which are normally near $V_{DD}$.

BRIEF DESCRIPTION OF THE DRAWINGS

FIG. 2 illustrates in block diagram form a static random access memory in accordance with the prior art;

DETAILED DESCRIPTION

Figure 1:
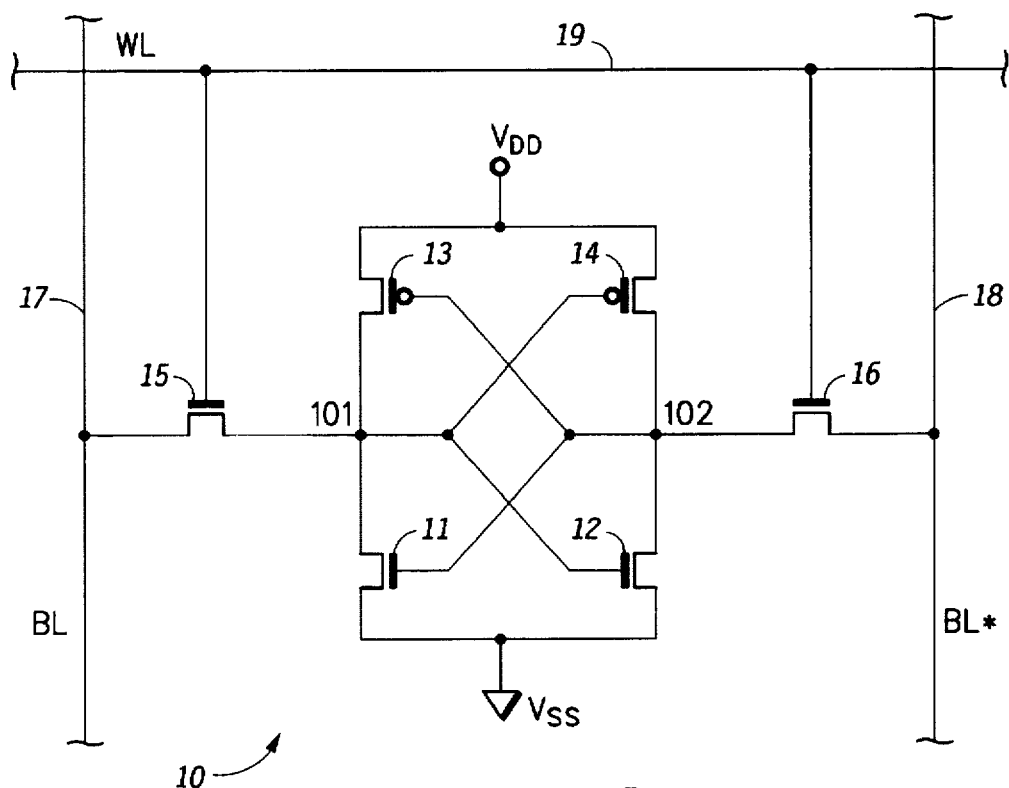
FIG. 1 illustrates in schematic diagram form a six-transistor SRAM cell according to the prior art.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 2 illustrates in block diagram form a static random access memory 30 in accordance with the prior art. Memory 30 includes memory block 31, row select circuitry 32, address buffer 34, row predecoder 36, column predecoder 38, and data I/O circuit 40. Memory block 31 includes bit line equalization block 42. Memory block 31 includes bit line equalization block 42, memory array 44 and column logic/decoder 46. Memory block 31 is a representative memory block of memory 30 and there may be other memory blocks present in memory 30. Memory cells in memory array 44 are located at intersections of word lines and bit line pairs.

Address buffer 34 receives an address signal labeled "ADDRESS", and provides a buffered differential row address labeled "ROW ADDRESS", and a buffered differential column address labeled "COLUMN ADDRESS". For simplicity, only one memory block 31 is shown. In other embodiments, different numbers of blocks, different sizes of blocks and different word widths could be used. A bit line equalization signal labeled "EQ" is provided to bit line equalization block 42. Bit line equalization block 42 may provide precharge and equalization to each bit line pair of memory array 31, thus decreasing the access time of memory 30.

Row predecoder 36 receives differential row address signals ROW ADDRESS, and in response, provides a plurality of predecoded row address signals labeled "PREDECODED ROW ADDRESS" to row select 32. Column predecoder 38 receives differential column address signals, COLUMN ADDRESS, and in response provides a plurality of predecoded column address signals labeled "PREDECODED COLUMN ADDRESS" to column logic/decoder 46. The particular address signals received by row predecoder 36 and column predecoder 38 have no special significance and may be different in other embodiments. Also, the amount of decoding performed by the row and column predecoders may be different in other embodiments.

In a preferred embodiment, memory 30 operates with a power supply voltage of about 3.3 volts, and memory array 44 is a very high density memory array having a feature size of about 0.5 microns or less. Memory cells in memory array 44 are located at intersections of word lines and bit line pairs. Row select 32 receives a predecoded row address and in response, enables one of the word lines. All of the memory cells connected to the enabled word line are able to provide their contents to their respective bit line pairs. Each bit line pair serves as an input to the memory cells during the write cycle of memory 30 and as an output during the read cycle. Column logic/decoder 46 couples the bit line pairs to be read or written, to data I/O circuit 40. During a write cycle, data I/O circuit 40 receives a plurality of single-ended data signals labeled "DATA", and provides differential data signals to selected bit line pairs. During a read cycle, data I/O circuit 40 receives differential data signals from selected bit line pairs and provides a plurality of single-ended data signals DATA. For example, for a word width of X4, column logic/decoder 46 may couple 4 bit line pairs to data I/O circuit 40. Note, that in a preferred embodiment, memory 30 may be synchronous or asynchronous.

To read data from memory 30, row predecoder 36 receives a row address decoded from buffered differential row address signals ROW ADDRESS, and provides predecoded row address PREDECODED ROW ADDRESS to row select 32, to select a word line. Each memory cell of memory array 44 that is coupled to the selected word line provides its output as a differential voltage on a corresponding bit line pair. Predecoded column address signals PREDECODED COLUMN ADDRESS are provided to column logic/decoder 46. Column logic/decoder 46 is also coupled to each bit line pair. The number of data signals provided to, or received from, memory 30 have no special significance and may be different in other embodiments. Column logic/decoder 46 senses and amplifies the relatively small differential voltage provided to the bit line pair, and couples the bit line pair to data input/output circuit 40. Data input/output circuit 40 receives a differential signal from column logic/decoder 46 corresponding to the differential signal from the bit line pair, and provides a single-ended data signal DATA to a data output pad (not shown).

During a write cycle of memory 30, the flow of data is essentially reversed. Single-ended data signal DATA is provided to data I/O circuit 40. Column predecoder 38 provides predecoded column address PREDECODED COLUMN ADDRESS to column logic/decoder 46 which couples data I/O circuit 40 to a bit line pair. Row predecoder 36 provides predecoded row address PREDECODED ROW ADDRESS to row select 32 which selects a word line. As in the read cycle, memory cells located on an enabled word line provide data to bit line pairs. However, a voltage differential driven onto the bit line pairs by column logic/decoder 46 is greater than the drive voltage of the memory cell and over writes a stored bit in the memory cell. At the end of a write cycle, the differential voltage on the bit line pair must be reduced to a level small enough to prevent the data from being erroneously written into a memory cell during the following read cycle. Equalization of the bit line pairs is achieved by bit line equalization block 42.

Figure 3:
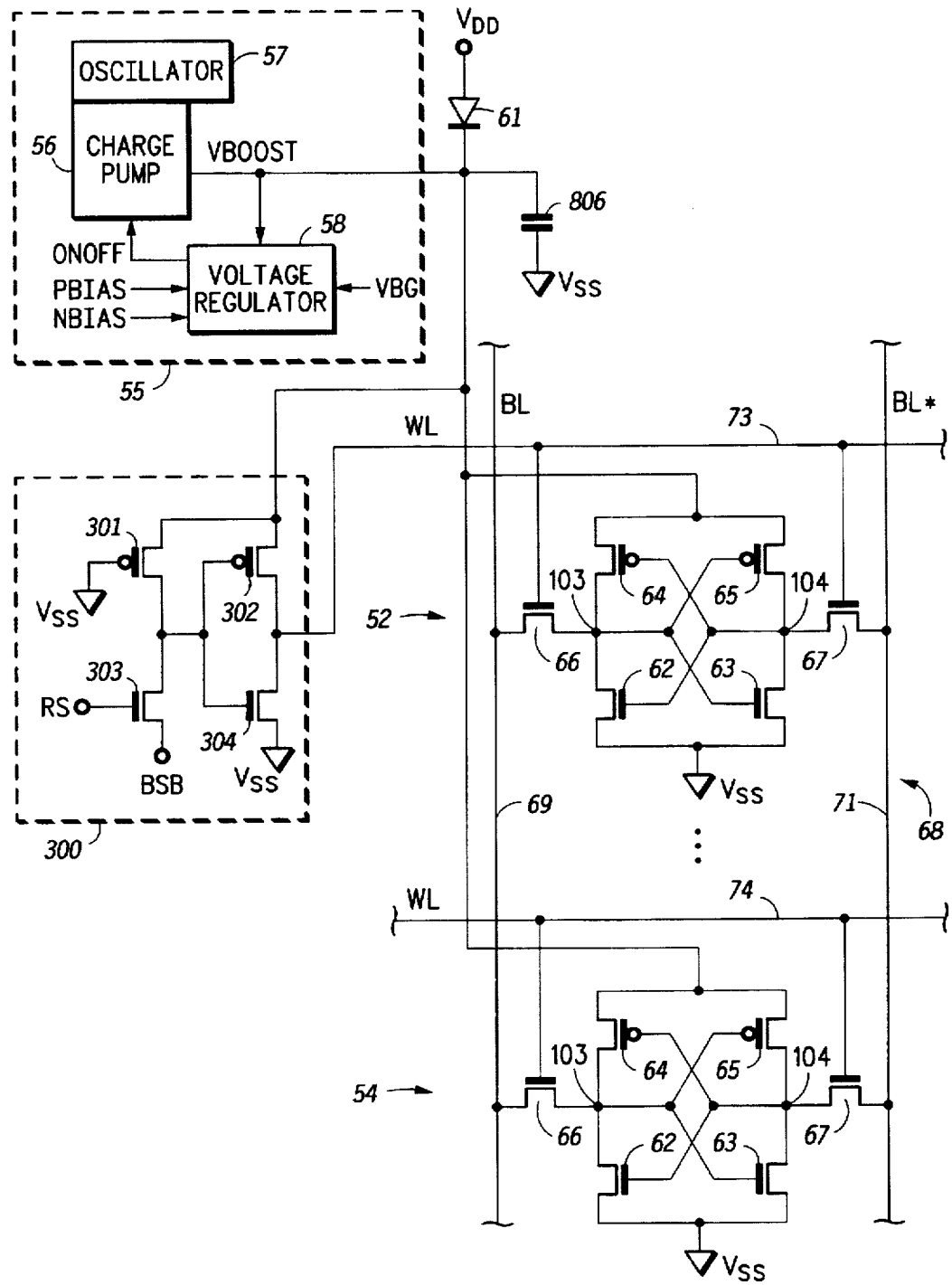
FIG. 3 illustrates in partial schematic diagram form and partial block diagram form a portion of the memory of FIG. 2 in accordance with an embodiment of the present invention.
Figure 7:
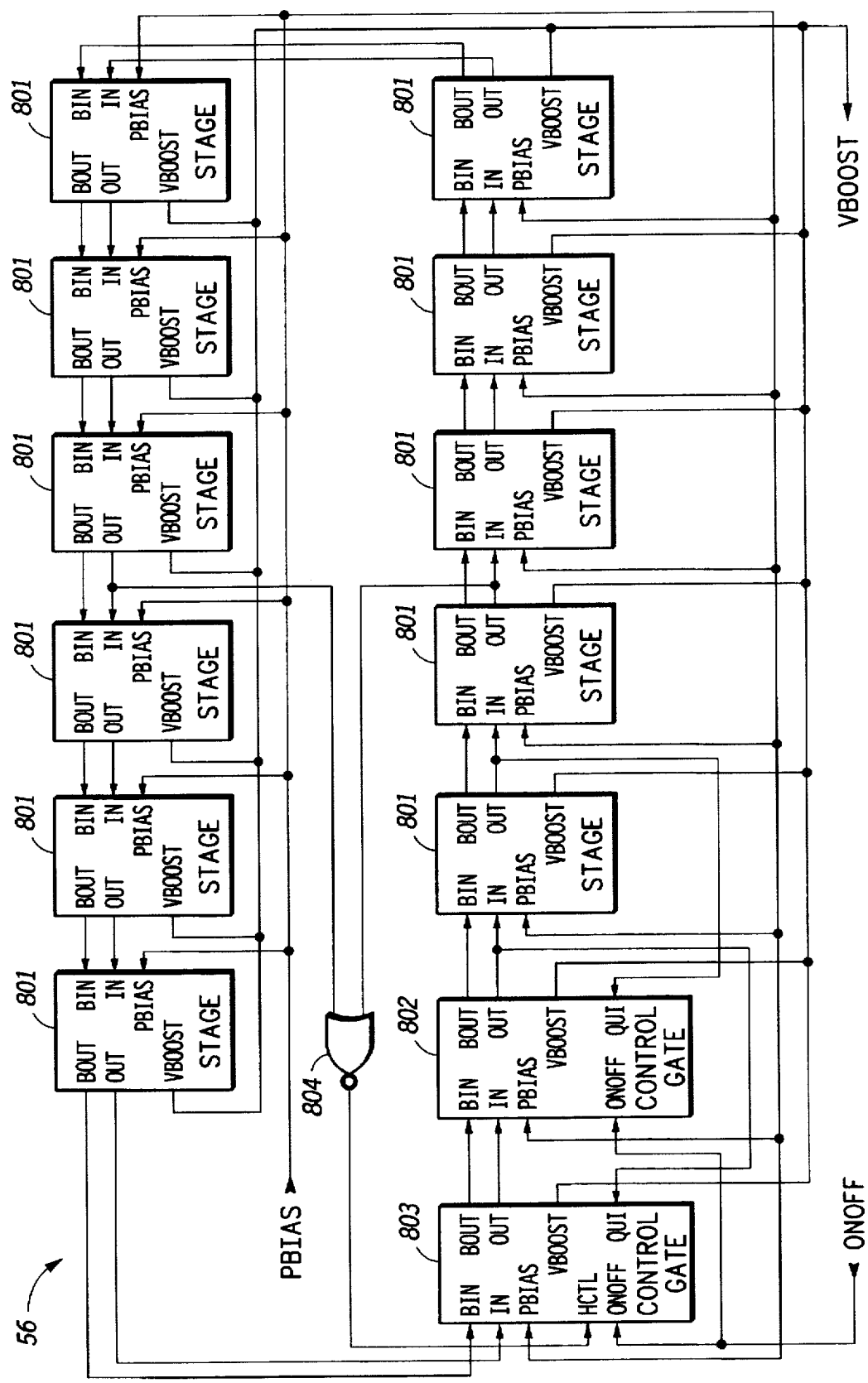
FIG. 7 illustrates a charge pump.

FIG. 3 illustrates in partial schematic diagram form and partial block diagram form a portion of memory 30 of FIG. 2 in accordance with an embodiment of the present invention. A plurality of memory cells in memory array 44, represented by memory cells 52 and 54, are connected to bit line pair 68. Bit line pair 68 includes bit lines 69 and 71. Charging circuit 55, diode 61, capacitor 806, and word lines 73 and 74 are also illustrated. Charge pump 56 provides output voltage VBOOST to voltage regulator 58 and to the second terminal of diode 61. VBOOST is also provided to capacitor 806, which increases the charge of VBOOST and functions as a filtering capacitor. Charging circuit 55 includes charge pump 56, oscillator 57, and voltage regulator 58. As illustrated in FIG. 7, described below, charge pump 56 may be integrally implemented with oscillator 57. A word line driver circuit 300 receives a row select signal labeled "RS", a block signal labeled "BSB", and power supply voltage, and in response, provides a logic high signal to word line 73.

Memory cells 52 and 54 are each six-transistor SRAM cells representative of the memory cells of memory array 44. Memory cells 52 and 54 each include N-channel transistors 62 and 63, P-channel transistors 64 and 65, and N-channel pass transistors 66 and 67. Memory cells 52 and 54 are high density memory cells designed to operate at low power supply voltages (approximately 3.3 volts). Therefore, it is important that the transistors of memory cells 52 and 54 have low leakage currents to reduce power consumption and to prevent unwanted voltage drops.

P-channel transistor 64 of memory cells 52 and 54 has a source for receiving a boosted supply voltage labeled "VBOOST", a gate connected to node 104, and a drain connected to node 103. N-channel transistor 62 has a drain connected to the drain of P-channel transistor 64 at node 103, a gate connected to the gate of P-channel transistor 64 at node 104, and a source connected to a negative power supply voltage terminal labeled "$V_{SS}$". N-channel transistor 63 has a drain connected to the gate of P-channel transistor 64 at node 104, a gate connected to the drain of N-channel transistor 62 at node 103, and a source connected to $V_{SS}$. P-channel transistor 65 has a source connected to the source of P-channel transistor 64 for receiving boosted supply voltage VBOOST, a gate connected to the drain of N-channel transistor 62, and a drain connected to the drain of N-channel transistor 63 at node 104.

N-channel pass transistors 66 and 67 of SRAM cell 52 each have a gate connected to word line 73 labeled "WL", and N-channel pass transistors 66 and 67 of SRAM cell 54 each have a gate connected to word line 74. N-channel pass transistor 66 of both SRAM cells 52 and 54 each have a first current electrode connected to bit line 69, and a second current electrode connected to node 103. N-channel pass transistor 67 of both SRAM cells 52 and 54 each has a first current electrode connected to bit line 71, and a second current electrode connected to node 104.

Diode 61 has a first terminal connected to a positive power supply terminal labeled "$V_{DD}$", and a second terminal connected to the sources of P-channel transistors 64 and 65 of both memory cells 52 and 54 of the plurality of memory cells. Charging circuit 55 provides boosted supply voltage VBOOST to the SRAM cells of memory array 44 of FIG. 2 as represented by memory cells 52 and 54. Voltage VBOOST is also provided to word-line driver 300, which is part of memory 44. Word-line driver 300 comprises PFET devices 301 and 302 and NFET devices 303 and 304 implemented as shown. The gate electrode of device 303 receives the predecoded row address while the drain electrode of device 303 receives the block addresses, which is part of the predecoded row address and part of the predecoded column address. As a result of this configuration, the word line varies between VBOOST and $V_{SS}$.

Switching the word line to VBOOST decreases the $V_T$ loss across the transfer device 66 when writing a "1", by increasing the gate voltage of the transfer device 66 to a voltage above $V_{DD}$. This is of particular advantage when $V_{DD}$ is near the minimum specified limit. As a result, there is a marked improvement in bit cell stability.

Charge pump circuit 56 may be a conventional charge pump or one like that disclosed in cross-referenced U.S. patent application Ser. No. [SC02731A]. Another example of a known charge pump circuit is taught in U.S. Pat. No. 5,138,190, entitled "Charge Pump Circuit." Oscillator 57 generates a series of pulses having a predetermined frequency. In one embodiment, oscillator 57 is a conventional ring oscillator, and diode 61 is a relatively large base-collector connected bipolar transistor. Diode 61 may also be a relatively large Schottky diode. Diode 61 may also be a diode-connected transistor where a first current electrode and a control electrode are coupled to $V_{DD}$ and a second current electrode is coupled to memory cells 52 and 54 and to word line driver 300. Charge pump circuit 56 has a capacitor that is charged and discharged in response to the oscillator pulse. By charging and discharging the capacitor, charge pump circuit 56 can obtain voltages exceeding the positive power supply voltage. Voltage regulator 58 receives boosted supply voltage VBOOST from charge pump circuit 56 and a band-gap generated reference voltage labeled "VBG". In response, voltage regulator 58 provides a feedback control signal labeled "ONOFF" to control the pumping operation of charge pump 56. Voltage regulator 58 controls the pumping operation of charge pump 56 within an upper and a lower voltage range. When boosted supply voltage VBOOST reaches a predetermined upper limit, voltage regulator 58 provides feedback signal ONOFF to disable charge pump 56. When voltage VBOOST drops to a predetermined lower limit, voltage regulator 58 provides feedback signal ONOFF to start the pumping operation of charge pump 56. In one embodiment, boosted supply voltage VBOOST varies about 100 millivolts (mV), having an upper limit of about 4.0 volts and a lower limit of about 3.9 volts.

During power up, memory array 44, including memory cells 52 and 54, receives a voltage equal to approximately the power supply voltage received at $V_{DD}$ minus a base-emitter diode voltage drop across diode 61. Charge pump 56 continues to increase the voltage to the predetermined upper limit. With an upper limit of about 4.0 volts, the logic high of nodes 103 and 104 will be equal to approximately 4.0 volts.

By keeping the supply voltage to memory array 44 above the power supply voltage, the voltage change due to an alpha particle "hit" $\Delta V_\alpha$ must be large in order to induce the logic change in the SRAM cell. Referring back to equation (1), a larger supply voltage will increase the critical charge $Q_{CRIT}$ required to change the logic state. Hence, the possibility of soft errors due to alpha particle hits is reduced without greater process constraints caused by adding capacitance to the cell. Also, in a preferred embodiment, P-channel transistors 64 and 65 are thin film transistor (TFT) loads. TFT transistors provide the advantages of low standby current and good cell stability without increasing cell size. The small transistor size of the TFT transistor results in lower power consumption and higher operating speeds. However, the small size of the memory cell also results in decreased cell capacitance, which in turn may cause increased soft error rates (SER) at low power supply voltage. By boosting the supply voltage received by P-channel transistors 64 and 65, the benefits of a smaller memory cell can be realized without increased SER, or increased process complexity to add capacitance to the memory cell. Also, cell stability is improved.

In one embodiment, a conventional back-bias generator (not shown) is used to provide a negative substrate bias. The negative substrate bias is more negative than ground, and improves the performance of the memory by increasing the threshold voltage ($V_T$) of transistors 62-63. An increased $V_T$ often provides higher margins and also improves soft error resistance.

Figure 4:
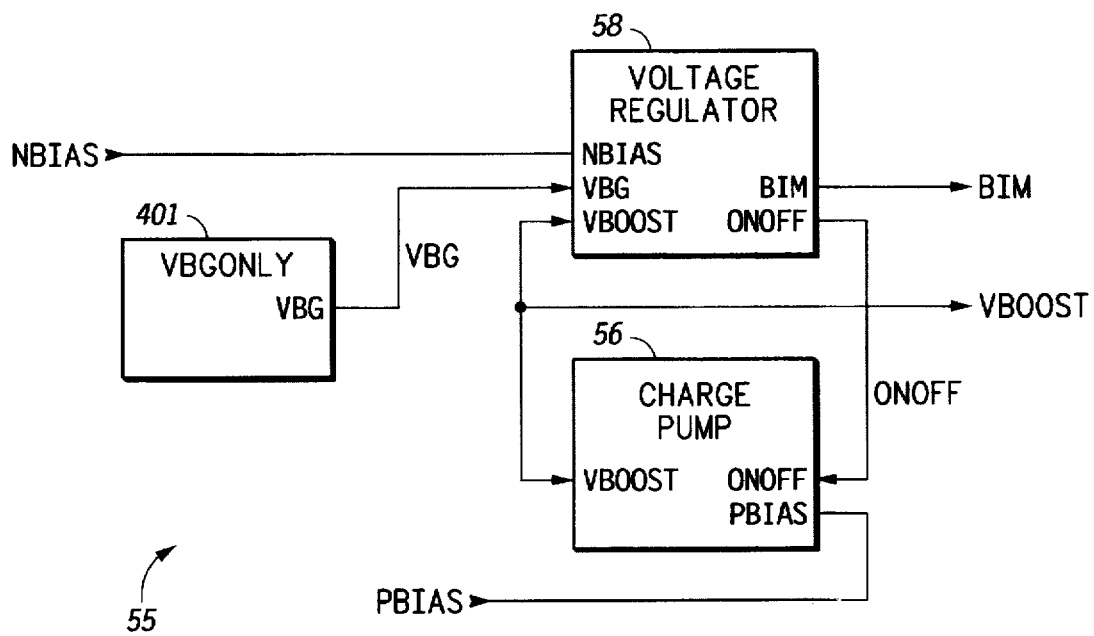
FIG. 4 illustrates in partial schematic diagram form and partial block diagram form a voltage regulator in accordance with the present invention coupled to a charge pump operable for providing a boosted voltage to an SRAM cell.

Referring next to FIG. 4, there is illustrated, in block diagram form, charging circuit 55, which includes voltage regulator 58 coupled to charge pump 56 and band-gap voltage source 401, labeled VBGONLY, supplying voltage VBG to voltage regulator 58.

Voltage regulator 58 receives an NBIAS signal. The NBIAS and PBIAS signals are reference voltages for P and N current source transistors. Voltage regulator 58 also receives the boosted voltage VBOOST from charge pump 56.

Voltage regulator 58 outputs a BIM signal. The BIM signal is a control signal, which may be utilized within other portions of the integrated circuit during a burn-in cycle, e.g., the BIM signal could turn off some other circuit (not shown) that needs to be deactivated during a burn-in cycle. Voltage regulator 58 also produces the ONOFF signal supplied to charge pump 56 for controlling the operation of charge pump 56.

Charge pump 56 outputs the VBOOST signal in response to the ONOFF signal received from voltage regulator 58. Charge pump 56 also receives a PBIAS signal.

Figure 5:
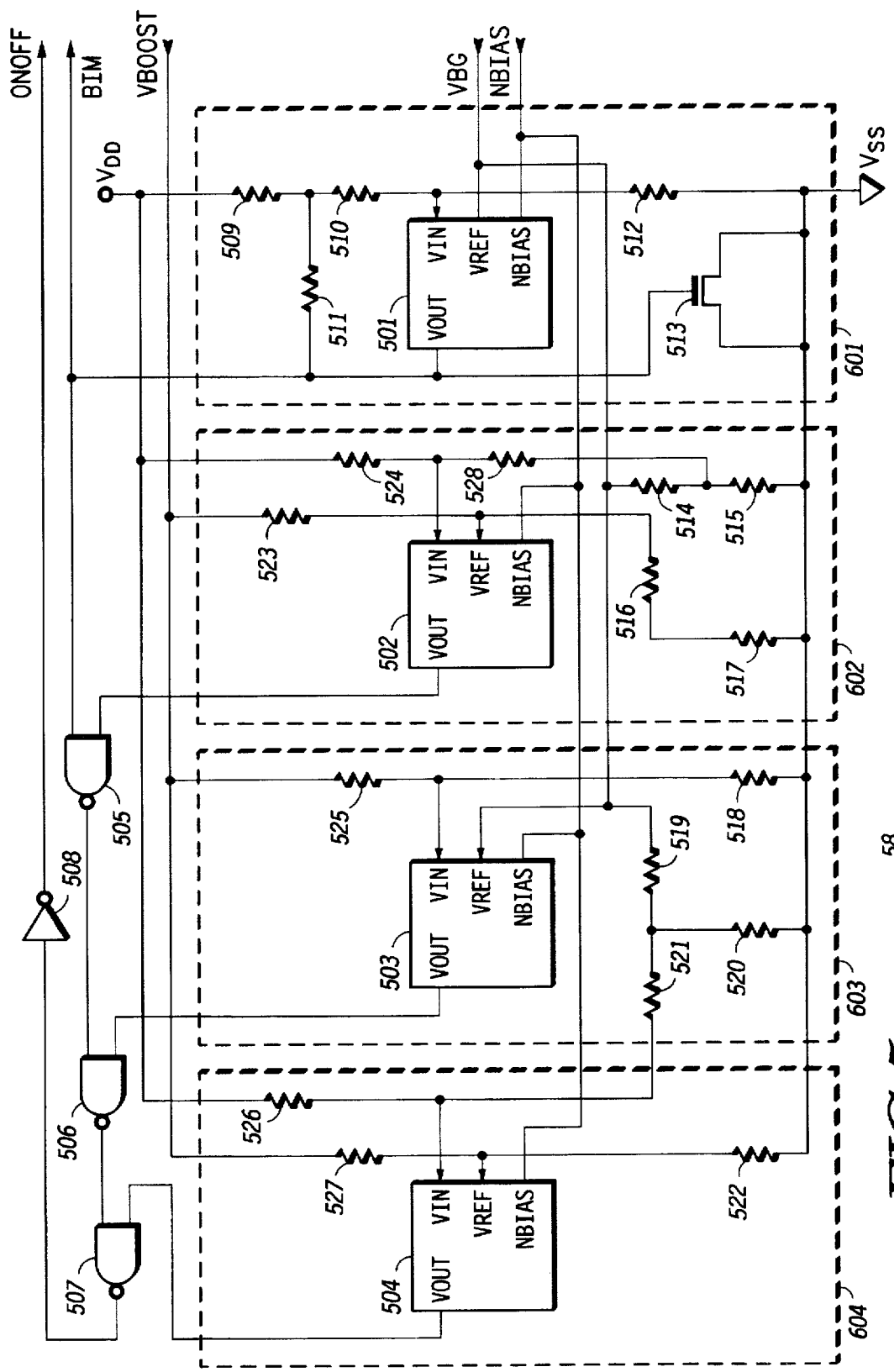
FIG. 5 illustrates in partial schematic diagram form and partial block diagram form the voltage regulator of the present invention.

Referring next to FIG. 5, there is illustrated voltage regulator 58 in further detail. BIMSENSE circuit 601 functions essentially as a comparator to sense that burn-in has commenced at 4.25 volts. Resistor 511 establishes hysteresis causing circuit 601 to come out of burn-in mode at 4.00 volts. The BIM signal may be used to map the correct signal to ONOFF. BIMSENSE circuit 601 receives voltage supply $V_{DD}$ through resistors 509 and 510. BIMSENSE circuit 601 also receives the VBG voltage at its VREF input, and receives the NBIAS signal at its NBIAS input. The output VOUT of BIMSENSE circuit 601 is provided to one of the inputs of NAND circuit 505 and is also outputted from regulator 58 as the BIM signal. The output node VOUT is also coupled to capacitor 513. The VIN input receiving the $V_{DD}$ voltage supply is also coupled to voltage source $V_{SS}$ through resistor value 512. Note that all of the resistor values shown in FIG. 5 have been selected so that the circuit illustrated in FIG. 6, and further described below, may operate to function as each of circuits 601, 602, 603 and 604. Circuits 501–504, each with its respective resistors, form differential feedback amplifiers.

BIMSET circuit 602 functions to set the VBOOST voltage at $V_{DD}$ plus 0.74 volts used during burn-in. Its output signal is supplied from output node VOUT to one of the inputs to NAND circuit 505.

The burn-in stress voltage is often set as a result of early burn-in data. Typically, this is done by varying $V_{DD}$. The primary goal of burn-in is to detect bit cell defects. By setting VBOOST to $V_{DD}$ plus 0.74 volts, the appropriate voltages are delivered to the bit line, word line, and bit cell. This is done to make sure that the VBOOST voltage remains greater than $V_{DD}$ during the burn-in cycle.

The VIN node of BIMSET circuit 602 is coupled to $V_{DD}$ through resistor value 524, and is also coupled to voltage source $V_{SS}$ through resistor values 528 and 515, and is coupled to the voltage VBG through resistor values 528 and 514.

The VREF input node of BIMSET circuit 602 receives the VBOOST voltage signal through resistor value 523. The VREF input node is also coupled to voltage source $V_{SS}$ through resistor values 516 and 517.

The NBIAS input node of BIMSET circuit 602 receives the NBIAS signal inputted into voltage regulator 58.

BOOST4V circuit 603 functions to set the VBOOST signal produced by charge pump 56 at a maximum reliable operating voltage, which in this example is 4 volts. The output node VOUT of BOOST4V circuit 603 is coupled to one of the inputs to NAND circuit 506, which receives at its other input the output of NAND circuit 505.

The VIN node of BOOST4V circuit 603 receives the VBOOST signal through resistor value 525, and is coupled to $V_{SS}$ through resistor value 518.

The VREF input node of BOOST4V circuit 603 is coupled to $V_{SS}$ through resistor values 519 and 520, and receives the VBG voltage.

The NBIAS input node of BOOST4V circuit 603 receives the NBIAS signal.

BOOSTCAP circuit 604 operates as a regulator to prevent VBOOST from exceeding $V_{DD}$ by more than 1.45 volts. This is because the switching of the word lines is a function of the VBOOST voltage, while the bit lines are biased to $V_{DD}$. If the gate to source voltage of transfer NFETs 66 and 67 exceed 1.45 volts (a threshold voltage with body effect), then there is a possibility that charge will be pulled out of the bit cell into the bit lines.

The output node VOUT of BOOSTCAP circuit 604 is coupled to one of the inputs of NAND circuit 507, which has its other input coupled to the output of NAND circuit 506.

The NBIAS input node of BOOSTCAP circuit 604 receives the NBIAS signal. The VREF input node of BOOSTCAP circuit 604 is coupled to $V_{SS}$ through resistor value 522 and receives the VBOOST signal through resistor value 527.

The VIN node of BOOSTCAP circuit 604 is coupled to $V_{DD}$ through resistor value 526 and is coupled to $V_{SS}$ through resistor values 521 and 520.

The output of NAND circuit 507 is coupled to the input of inverter circuit 508, which produces at its output the ONOFF signal.

BOOSTCAP circuit 604 senses when the VBOOST signal provided to the VREF input node exceeds the $V_{DD}$ signal supplied to the VIN node by more than 1.45 volts. This 1.45 volts is configured through the use of resistor values 526, 527, 520, 521 and 522. When the VBOOST signal exceeds the $V_{DD}$ signal by more than 1.45 volts, a low signal is outputted from node VOUT. This low signal provided to one of the inputs to NAND circuit 507 results in NAND circuit 507 outputting a high signal, which is inverted by inverter circuit 508, resulting in the ONOFF signal going low. This low ONOFF signal operates to turn off charge pump 56, which allows the discharge of the VBOOST voltage. When the VBOOST voltage transitions below $V_{DD}$+1.45 volts, then the VOUT node will output a high signal.

BOOST4V circuit 603 operates to keep the VBOOST voltage at around 4 volts during normal operation. The VREF input is coupled to the VBG signal, the $V_{SS}$ supply, and the $V_{DD}$ supply. The various resistor values coupled between these voltage sources and input node VREF, along with resistor value 525 coupled between VIN and VBOOST and resistor value 518 coupled between VIN and $V_{SS}$, all assist in setting this boost voltage at 4 volts. When the BOOST4V circuit 603 detects that the VBOOST voltage is below 4 volts, the VOUT node will output a low signal, which is supplied to NAND circuit 506. This causes NAND circuit 506 to output a high signal, which is supplied to one of the inputs of NAND circuit 507. If BOOSTCAP circuit 504 has not sensed that the VBOOST voltage has exceeded $V_{DD}$ by more than 1.45 volts, then NAND circuit 507 will be receiving two high signals at its input. This results in a low signal being outputted from NAND circuit 507, which is inverted by inverter 508 to produce a high signal as the ONOFF signal, thus activating charge pump 56 to result in the VBOOST signal rising until it reaches approximately 4 volts. When this occurs, BOOST4V circuit 603 will output a high signal, which is supplied to the input of NAND circuit 506. This will cause the output of NAND circuit 506 to be a low signal, since the output of NAND circuit 505 is a logic 1 when $V_{DD}$ is below 4.25 volts. The output of NAND circuit 507 is a logic 1 and inverter 508 is a logic 0. (See FIG. 11, which is discussed later.)

During burn-in, $V_{DD}$ is raised above its normal operating level. BIMSET circuit 602 monitors the $V_{DD}$ signal at its VIN input. The VBOOST signal is monitored at the VREF input of BIMSET circuit 602. As discussed above, the BIMSET circuit 602 acts as a regulator to set the VBOOST signal outputted from charge pump 56 at $V_{DD}$ plus 0.74 volts. Again, the various resistor values associated with the signals received at the VIN and VREF input nodes are configured to provide this type of regulation.

BIMSENSE circuit 601 acts to sense burn-in when $V_{DD}$ rises to 4.25 volts. Again, the various resistor values associated with circuit 601 are configured so that circuit 601 senses burn-in when $V_{DD}$ equals about 4.25 volts. Resistor 511 causes hystersis of about 2.5 volts to avoid oscillation of signal BIM near the 4.25 volt threshold.

Note, the resistor values within regulator 58 may be configured by one skilled in the art so that all of the various voltages within this description may be altered to other desired values.

When BIMSENSE circuit 601 senses that $V_{DD}$ has risen above 4.25 volts, then it will output a high signal through output VOUT. This high signal will be provided to one of the inputs of NAND circuit 505. BIMSET circuit 602 also senses that VBOOST does not exceed $V_{DD}$ by about 0.74 volts (a $V_T$), which causes VIN to exceed VREF, causing a high output at output node VOUT from BIMSET circuit 602. This high signal is also provided to NAND circuit 505. Since NAND circuit 505 now receives two high signals, it will output a low signal, causing NAND circuit 506 to output a high signal. Since the output of BOOSTCAP circuit 604 is normally high when VBOOST exceeds $V_{DD}$, NAND circuit 507 will then output a low signal, which is inverted into a high signal by inverter circuit 508. This high ONOFF signal causes charge pump 56 to turn on to start increasing the VBOOST voltage so that it exceeds $V_{DD}$ by the designated value, herein 0.74 volts. When VBOOST exceeds $V_{DD}$ by 0.74 volts, the output of circuit 602 will cause the output of inverter 508 to be reduced to a logic 0, thus turning off charge pump 56.

VBG is a bandgap voltage of 1.173 volts, which varies only a few millivolts over voltage and temperature. VBG is produced by a conventional bandgap voltage generator circuit and will not be discussed in detail. Amplifiers 501–504 use multiples of the VBG voltage (set by their resistor networks) to derive precise trip points for the comparison.

Figure 6:
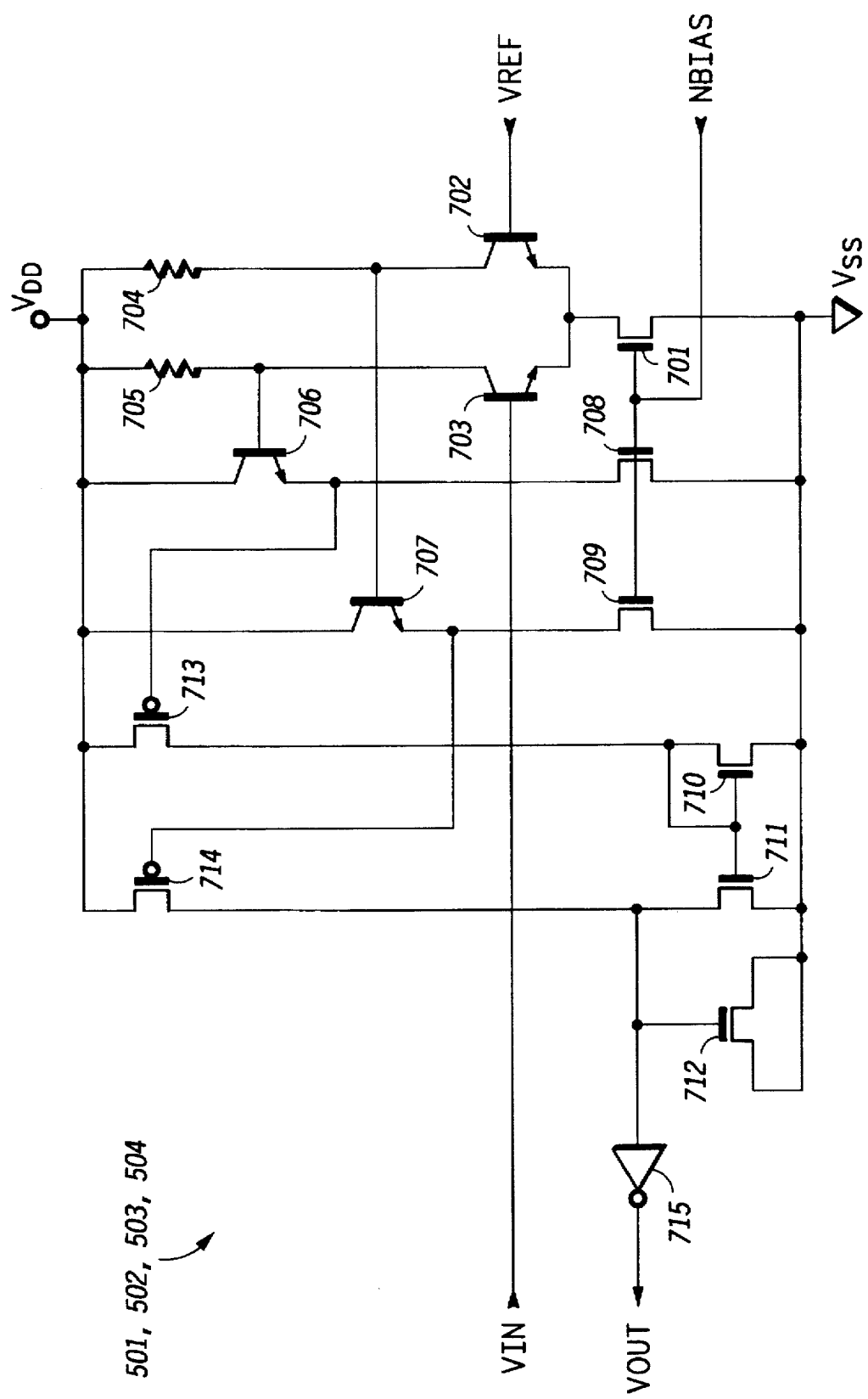
FIG. 6 illustrates in schematic diagram form, circuits 501, 502, 503 and 504 illustrated in FIG. 5.

Referring next to FIG. 6, there is illustrated the circuit embodying each of amplifiers 501–504 of regulator 58. This circuit illustrated in FIG. 7 essentially operates as a comparator, which produces a high output signal at VOUT when VIN is greater than VREF.

The VIN input node is coupled to the base of bipolar transistor 703. The VREF input node is coupled to the base of bipolar transistor 702. Transistors 702 and 703 are a differential pair. The emitters of transistors 702 and 703 are coupled together and to the drain electrode of NFET 701, which has its gate electrode coupled to the input node NBIAS and its source is also coupled to voltage source $V_{SS}$. The collectors of transistors 702 and 703 are coupled to $V_{DD}$ through resistors 704 and 705, respectively. The collector of transistor 702 is also coupled to the base of bipolar transistor 707. The collector of transistor 703 is coupled to the base of bipolar transistor 706. The collectors of transistors 706 and 707 are coupled to $V_{DD}$. The emitter electrodes of transistors 706 and 707 are coupled to the drain electrodes of NFET transistors 708 and 709, respectively. The gate electrodes of devices 708 and 709 also receive the NBIAS signal. The source electrodes of devices 708 and 709 are coupled to $V_{SS}$. Devices 701, 708 and 709 are configured as current sources.

The emitters of emitter followers 706 and 707 are coupled to the gate electrodes of PFET transistors 713 and 714, respectively. The source electrodes of transistors 713 and 714 are coupled to $V_{DD}$. The drain electrodes of transistors 713 and 714 are coupled to the drain electrodes of NFET current mirror devices 710 and 711, respectively. The gate electrodes of devices 710 and 711 are coupled and are also coupled to the drain electrode of device 710. The source electrodes of devices 710 and 711 are coupled to $V_{SS}$, which is also coupled to the drain and source electrodes of NFET decoupling capacitor 712. The gate electrode of NFET 712 is coupled to the drain electrode of PFET 714 and the drain electrode of NFET 711. This connecting node is coupled to the input of inverter 715 which produces the VOUT signal.

Devices 701–709 in FIG. 6 essentially operate as a differential amplifier, while devices 710–711 and 713–714 operate as a current mirror. The current mirror and differential amplifiers are well-known standard circuits.

NBIAS is derived from the conventional band-gap generator, and is the reference voltage for an N-channel transistor used as a constant current source.

Referring next to FIG. 7, there is illustrated charge pump 56, which produces the VBOOST boosted voltage in response to receipt of the ONOFF signal from voltage regulator 58. Charge pump 56 also receives the PBIAS signal at each of stages 801 and control gates 802 and 803. The PBIAS signal is a reference voltage biased to drive P-device constant current sources.

Charge pump 56 may alternatively comprise any well-known charge pump for producing a boosted voltage in response to an ONOFF signal from a voltage regulator. Further, charge pump 56 may comprise the charge pump described within co-pending U.S. patent application Ser. No. [SC-02731A], cross-referenced above. Stages 801 and control gates 802 and 803 are configured in a ring as a ring-oscillator to produce an oscillating signal, which is utilized to drive the charge pumping capacitors within each of the stages and control gates. The charge from these charging capacitors is outputted from the VBOOST outputs of each of these stages and control gates, which is used to produce the VBOOST signal. These VBOOST output nodes are also coupled to the emitter of bipolar device 61, which is configured as a diode to act as a bootstrap during power-up. The collector of device 61 is coupled to $V_{DD}$. The VBOOST output is also coupled to capacitor 806, which increases the charge reservoir on VBOOST and acts as a filter capacitor.

NOR gate 804 operates to prevent harmonics and a mid-state condition. The inputs of NOR gate 804 are coupled to the outputs of selected stages 801. The output of NOR gate 804 is coupled to the HCTL input of control gate 803.

The ONOFF signal is received at the ONOFF inputs of control gates 802 and 803. The various stages 801 and control gates 802 and 803 are further described below.

Figure 8:
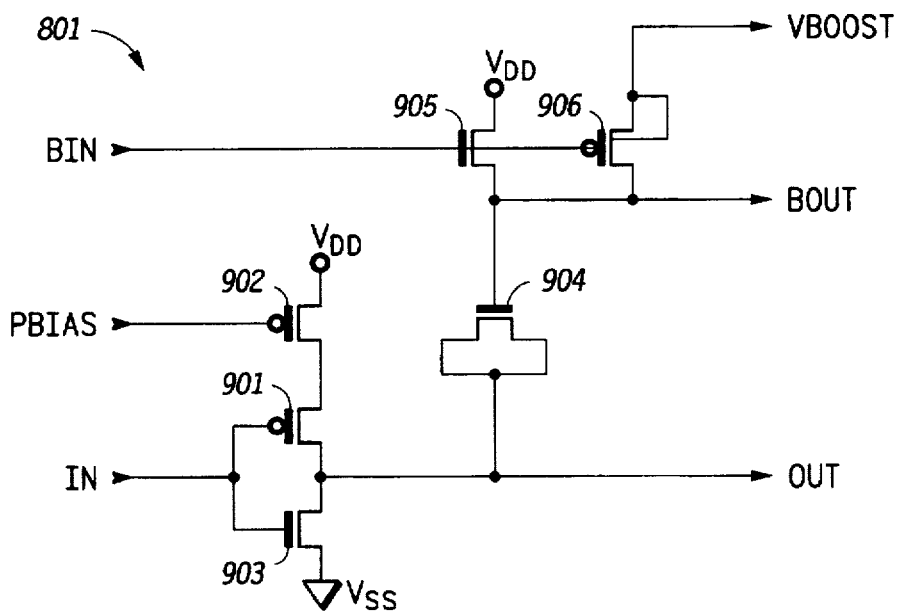
FIG. 8 illustrates an inverter stage within the charge pump illustrated in FIG. 7.

Referring next to FIG. 8, there is illustrated a circuit diagram of one of stages 801. The inverter comprised of PFET 901 and NFET 903 receives the oscillating signal IN from the previous stage 801 and inverts this signal sending it on through node OUT to the next stage 801. This signal is also used to charge pump capacitor 904.

PFET 902, having its N-well coupled to $V_{DD}$, operates to receive the PBIAS signal and acts as a current source for the inverter.

Pump capacitor 904 is also coupled to output node BOUT, which is coupled to voltage source $V_{DD}$ through NFET device 905. NFET device 905 receives at input node BIN the BOUT signal from the previous stage 801. This BIN signal is also received at the gate electrode of PFET device 906 which is a PMOSFET which has its N-well coupled to the VBOOST output node. The boost feed-forward signal from the previous ring stage 801 turns on device 905 as OUT decreases and turns on PFET 906 hard before BOUT increases, preventing hole injection.

Figure 9:
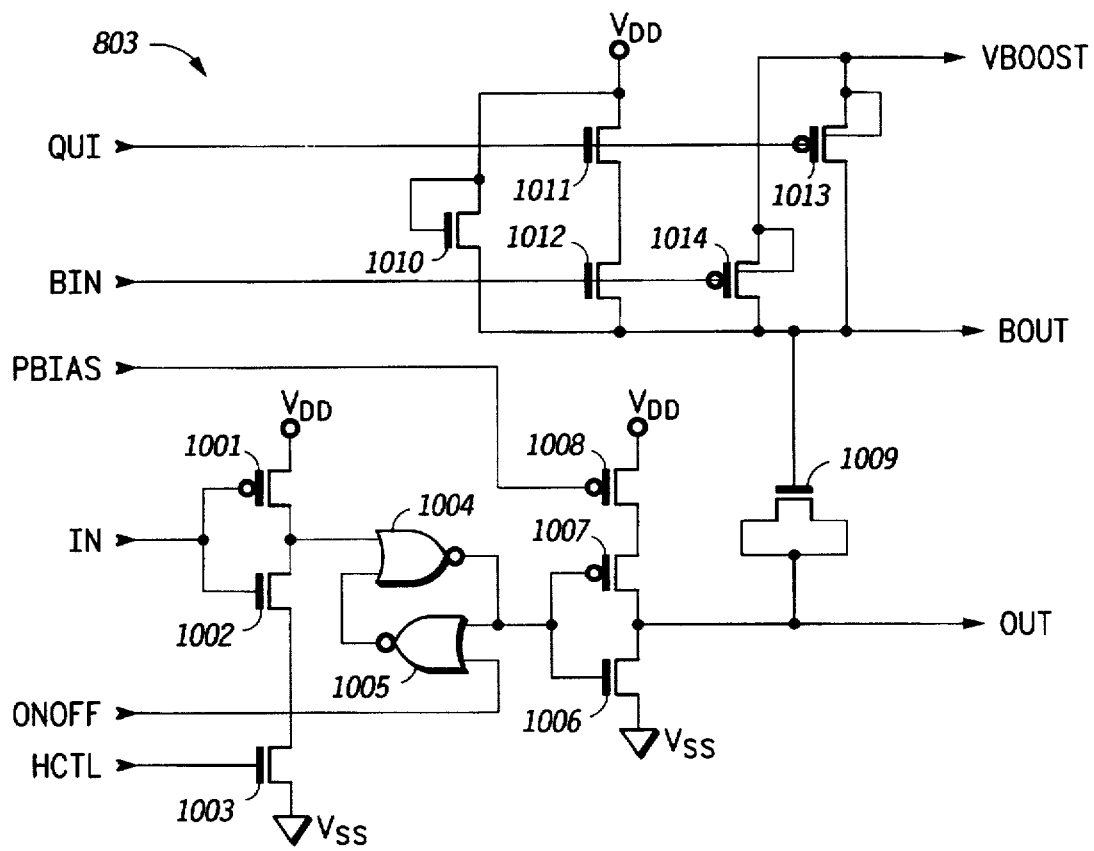
FIG. 9 illustrates a control gate stage of the charge pump illustrated in FIG. 7.

Referring next to FIG. 9, there is illustrated control gate 803. The inverter comprising PFET 1007 and NFET 1006 operates in a similar fashion as the inverter of circuit 801. PFET 1008 operates similarly as PFET 902 in receiving the PBIAS signal. The remainder of circuit 803 that operates in a fashion similar to the circuitry within stage 801 is pump capacitor 1009, NFET device 1012 and PFET device 1014 which operate similarly as devices 904, 905 and 906, respectively.

NFET device 1010 acts to bootstrap the distributed charge pump during power up. Device 1011 prevents device 1012 from leaking current when ONOFF is a logic 0. A device like 1011 is not needed in FIG. 8 because when ONOFF is a logic 0, N-channel transistor 905 is substantially nonconductive, or off.

NFET 1003, coupled to the inverter comprising devices 1001 and 1002, operates to receive the HCTL signal from NOR gate 804. Device 1003 with NOR logic gate 804 functions to filter harmonics in the oscillator comprising the ring of pump stages 801.

The current source 1008 reduces ring speed dependence upon $V_{DD}$.

The double NOR gates comprising devices 1004 and 1005 are required to have a clean ring halt/start. A logic 0 received at input node IN when input ONOFF is off locks the ring oscillator off with a logic 0 into device 1005 and a logic 1 into device 1004. Thereafter, the ring oscillator starts clean as ONOFF becomes a logic 1, because it releases the lock without requiring a state flip.

Figure 10:
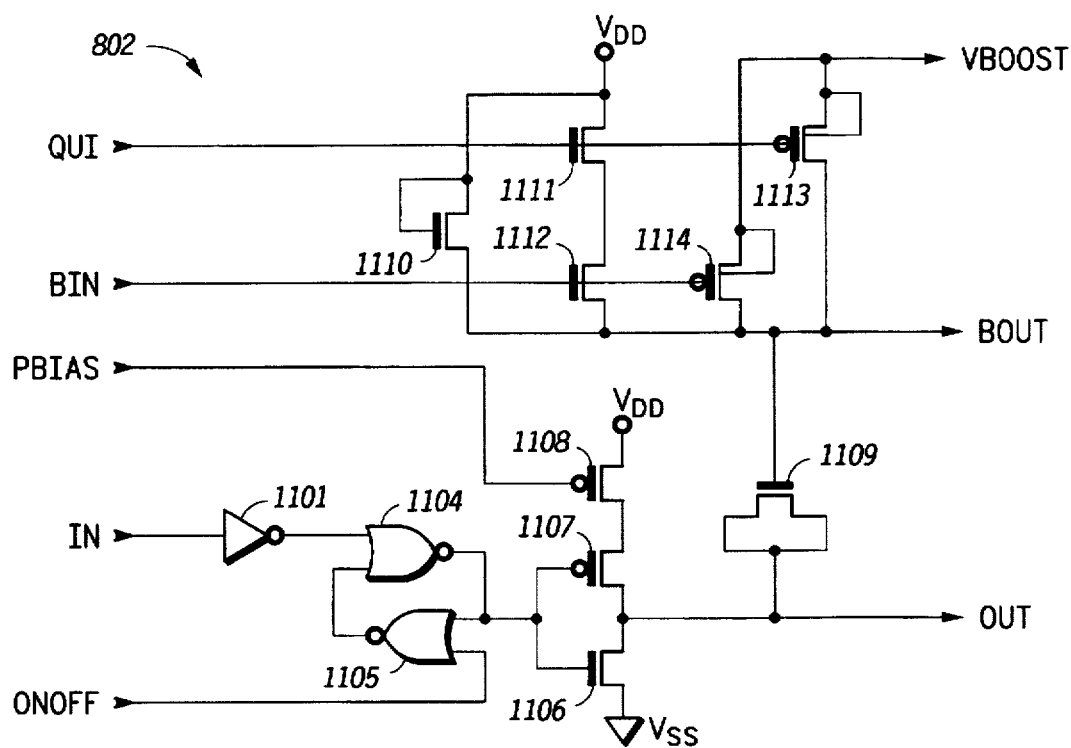
FIG. 10 illustrates a second control gate stage of the charge pump illustrated in FIG. 7.

Referring next to FIG. 10, there is illustrated the second control gate 802. Inverter 1101 operates similarly as the inverter in circuit 803 comprising devices 1001 and 1002. The double NOR gate 1104 and 1105 is similar to the double NOR gate 1004 and 1005. The inverter stage comprising devices 1106 and 1107, along with current source 1108, operates similarly as a devices 1006–1008. Pump capacitor 1109 operates similarly as pump capacitor 1009, and devices 1110–1114 operate similarly as devices 1010–1014. HCTL and the devices used for filtering the harmonics are not needed in this stage.

Figure 11:
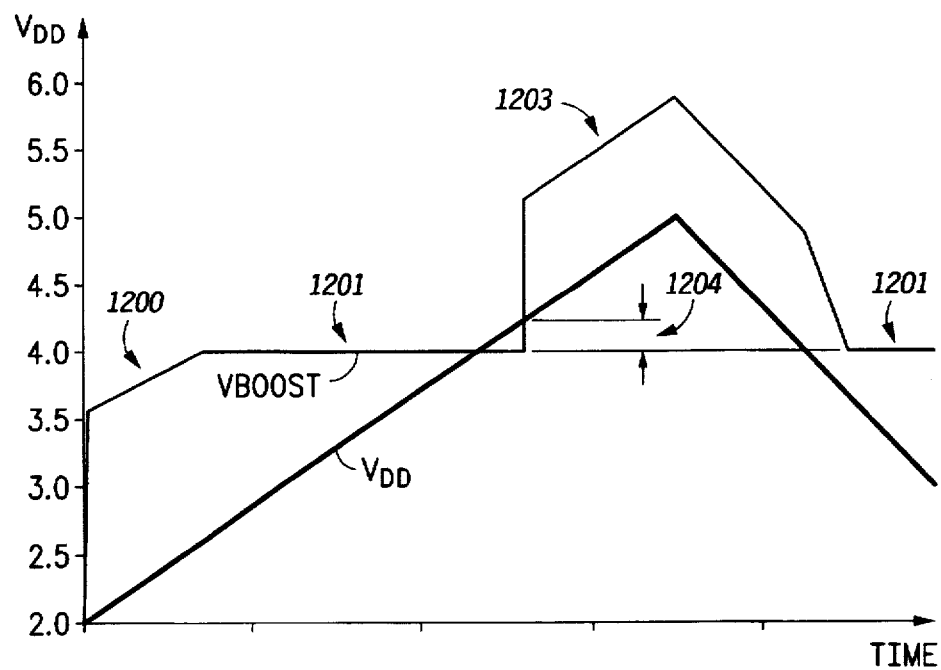
FIG. 11 illustrates in graph form the boosted voltage created by the charge pump illustrated in FIG. 7 with respect to the supply voltage $V_{DD}$.

Referring next to FIG. 11, there is illustrated a graph of VBOOST versus $V_{DD}$ as configured in one embodiment of the present invention. Note, as $V_{DD}$ increases, a steady state independent of $V_{DD}$ of approximately 4 volts is achieved in VBOOST over period 1201. If $V_{DD}$ falls below a certain level, then VBOOST will follow $V_{DD}$ during this low supply period 1200. As described above, if VBOOST were not lowered along with $V_{DD}$ as $V_{DD}$ continues to decrease, VBOOST would become more than 1.45 volts greater than $V_{DD}$, which would result in the bit line pulling charge out of the bit cell. Furthermore, the lower VBOOST voltage may be needed for tests of circuit margins to optimize the bit cell stability at low voltages by determining if there are any defective bit cells within the memory.

During burn-in, as $V_{DD}$ increases, VBOOST increases accordingly during period 1203. The hysteresis loop illustrated as 1204 is implemented by the regulator 58 so that the VBOOST voltage is prevented from jumping between the operating mode 1201 and the burn-in mode 1203.

Although the present invention and its advantages have been described in detail, it should be understood that various changes, substitutions and alterations can be made herein without departing from the spirit and scope of the invention as defined by the appended claims.

What is claimed is:

1. A voltage regulator for regulating an output of a boosted voltage from a charge pump to be supplied to a memory circuit, said regulator comprising:

circuitry for sensing said boosted voltage;

circuitry, coupled to said sensing circuitry, for setting said boosted voltage to one of a plurality of operating states; and circuitry, coupled to said setting circuitry, for controlling an operation of said charge pump during said one of said plurality of operating states.

2. The regulator as recited in claim 1, wherein said one of said plurality of operating states is a normal operating state wherein said boosted voltage is substantially maintained at a predetermined voltage level.

3. The regulator as recited in claim 2, wherein said setting circuitry further comprises:

circuitry for comparing said sensed boosted voltage to a reference voltage; and circuitry, coupled to said comparing circuitry, for outputting a signal to activate said charge pump when said boosted voltage decreases relative to said reference voltage.

4. The regulator as recited in claim 1, wherein said one of said plurality of operating states is a burn-in operating state wherein said boosted voltage is maintained at a predetermined level relative to a supply voltage provided to said memory circuit.

5. The regulator as recited in claim 4, wherein said setting circuitry further comprises:

circuitry for sensing when said supply voltage exceeds a first preselected voltage level;

circuitry, coupled to said supply voltage and to said circuitry for sensing said boosted voltage, for outputting a signal to control said charge pump in order to maintain said boosted voltage at said predetermined level relative to said supply voltage; and circuitry for sensing when said supply voltage decreases below a second preselected voltage level.

6. The regulator as recited in claim 5, wherein said circuitry for sensing when said supply voltage exceeds said first preselected voltage level and said circuitry for sensing when said supply voltage decreases below said second preselected voltage level form a hysteresis loop in an operation of said charge pump between said burn-in operating state and a normal operating state of said charge pump.

7. The regulator as recited in claim 1, wherein said one of said plurality of operating states is a low-voltage operating state wherein said boosted voltage is maintained at a predetermined level relative to a supply voltage provided to said memory circuit when said supply voltage decreases below its normal voltage level.

8. The regulator as recited in claim 7, wherein said memory circuit is an SRAM, and wherein said setting circuitry further comprises:

circuitry, coupled to said supply voltage and said sensing circuitry, for outputting a signal to control an operation of said charge pump to maintain said boosted voltage at said predetermined level.

9. The regulator as recited in claim 1, wherein said setting circuitry further comprises:

circuitry, coupled to said sensing circuitry and to a supply voltage provided to said memory circuit, for outputting a signal to control an operation of said charge pump so that said boosted voltage does not exceed said supply voltage by a predetermined amount.

10. The regulator as recited in claim 1, wherein said setting circuitry further comprises:

first comparing circuitry for comparing a sensed supply voltage with a reference voltage;

first outputting circuitry, coupled to said first comparing circuitry, for outputting a first signal when said supply voltage exceeds the reference voltage;

second comparing circuitry for comparing said boosted voltage with said supply voltage;

second outputting circuitry, coupled to said second comparing circuitry, for outputting a second signal when said boosted voltage decreases below said supply voltage plus a predetermined amount;

third comparing circuitry for comparing said boosted voltage with said reference voltage;

third outputting circuitry, coupled to said third comparing circuitry, for outputting a signal when said boosted voltage decreases relative to said reference voltage;

fourth comparing circuitry for comparing said boosted voltage with said supply voltage; and fourth outputting circuitry, coupled to said fourth comparing circuitry, for outputting a signal when said boosted voltage increases a predetermined amount above said supply voltage.

11. The regulator as recited in claim 10, further comprising:

a first NAND gate having its inputs coupled to said first, and second outputting circuitry;

a second NAND gate having its inputs coupled to said third outputting circuitry and an output of said first NAND gate;

a third NAND gate having its inputs coupled to said fourth outputting circuitry and an output of said second NAND gate; and an inverter coupled to an output of said third NAND gate and to said charge pump.

12. A method for providing a boosted voltage to semiconductor circuitry, said method comprising the steps of:

monitoring a supply voltage provided to said semiconductor circuitry;

sensing said boosted voltage; and adjusting said boosted voltage in response to a change in said supply voltage.

13. The method as recited in claim 12, wherein said adjusting step further comprises the step of:

increasing said boosted voltage when said supply voltage increases.

14. The method as recited in claim 13, wherein said increasing step further comprises the steps of:

activating a charge pump supplying said boosted voltage for a period of time sufficient to maintain said boosted voltage at a predetermined level relative to said supply voltage.

15. The method as recited in claim 14, wherein said adjusting step further comprises the step of:

decreasing said boosted voltage when said supply voltage decreases.

16. The method as recited in claim 15, wherein said increase in said supply voltage occurs during a burn-in mode of said semiconductor circuitry, and wherein said decreasing step further comprises the step of:

controlling said charge pump so that said boosted voltage is maintained at said predetermined level.

17. The method as recited in claim 16, wherein said boosted voltage exhibits a hysteresis loop during said increasing and decreasing steps when said boosted voltage enters and exits said burn-in mode from a normal operating mode.

18. The method as recited in claim 12, wherein said semiconductor circuitry comprises an SRAM, and wherein said adjusting step further comprises the steps of:

decreasing said boosted voltage when said supply voltage decreases below a normal operating mode, wherein said boosted voltage is maintained at a predetermined level relative to said supply voltage.

19. The method as recited in claim 12, wherein said adjusting step further comprises the step of:

preventing said boosted voltage from exceeding said supply voltage by a predetermined amount.

20. An integrated circuit comprising:

a memory circuit;

a terminal for receiving a supply voltage at a first potential level, said terminal coupled to said memory circuit;

a charge pump coupled to said memory circuit for providing a voltage potential at a second potential level; and a regulator circuit for regulating an output of said voltage potential from said charge pump, wherein said regulator circuit further comprises:

circuitry for monitoring said first potential level;

circuitry for monitoring said second potential level; and circuitry for adjusting said second potential level in response to said first potential level.

21. The integrated circuit as recited in claim 20, wherein said adjusting circuitry further comprises:

circuitry for activating said charge pump providing said second potential level for a period of time sufficient to maintain said second potential level at a predetermined level higher than said first potential level when said first potential level increases above a normal operating level during a burn-in cycle;

circuitry for decreasing said second potential level when said first potential level decreases during said burn-in cycle, wherein said predetermined level is maintained, and wherein said second potential level exhibits a hysteresis loop when said second potential level enters and exits said burn-in cycle from said normal operating level.

22. The integrated circuit as recited in claim 20, wherein said adjusting circuitry further comprises:

circuitry for decreasing said second potential level when said first potential level decreases below a normal operating level, wherein said second potential level is maintained at a predetermined level higher than said first potential level.

23. The integrated circuit as recited in claim 20, wherein said adjusting circuitry further comprises:

circuitry for preventing said second potential level from exceeding said first potential level by a predetermined amount.

* * * * *